United States Patent [19]
Pearce

[11] 4,045,775
[45] Aug. 30, 1977

[54] CONTINUOUS DC CONTROL CIRCUIT

[75] Inventor: Daniel S. Pearce, LeRoy, N.Y.

[73] Assignee: GTE Sylvania Incorporated, Stamford, Conn.

[21] Appl. No.: 628,097

[22] Filed: Nov. 3, 1975

[51] Int. Cl.² .............................................. H04N 9/12
[52] U.S. Cl. .................................. 340/147 R; 358/194
[58] Field of Search ................. 178/DIG. 15, 5.4 HE; 340/147 R

[56] References Cited

U.S. PATENT DOCUMENTS

| | | | |
|---|---|---|---|
| 3,713,028 | 1/1973 | Boyd | 178/DIG. 15 |
| 3,798,362 | 3/1974 | Salto | 178/DIG. 15 |
| 3,820,027 | 6/1974 | Maier | 178/DIG. 15 |

Primary Examiner—Harold I. Pitts
Attorney, Agent, or Firm—Norman J. O'Malley; Thomas H. Buffton; Robert T. Orner

[57] ABSTRACT

A continuous DC control circuit includes a memory capacitor coupled to a sampling means providing an output signal representative of the charge thereon and to a charge and discharge circuit means connected to a switching means coupled to a potential source and to a control circuit means for selectively altering the operation of the switching means to effect application of different potential levels to cause different rates of charging and discharging of the memory capacitor.

2 Claims, 2 Drawing Figures

CONTINUOUS DC CONTROL CIRCUIT

BACKGROUND OF THE INVENTION

This invention relates to a continuous DC control circuit and more particularly to a continuous DC control circuit employing a single potential source, a memory capacitor, and charge and discharge circuits having different time constants whereby a continuous DC control potential is provided.

Frequently, television receivers include a remote receiver and transmitter whereby specific functions of the receiver are remotely controlled. Usually, the receiver includes a plurality of frequency detectors which are individually activated in accordance with a transmitted signal at a given frequency.

In turn, the frequency detector initiates a control function by energizing or activating apparatus associated with the television receiver. For example, prior art remote control systems frequently employed bi-directional motors which were activated by a remote signal of a given frequency and mechanically altered the positional location of the adjustable arm of a potentiometer. In this manner, functions, such as volume for example, were readily adjusted by a remote control system.

In more recent apparatus the previously described and relatively expensive bi-directional motor systems were replaced by a charge storage and sampling means. Therein, a memory capacitor is employed to store a charge which is sampled to provide a continuous output potential in accordance with the charge which is, in turn, controlled by detection of a transmitted signal. Moreover, an example of one such system is disclosed in U.S. Pat. No. 3,637,922 issued to Gopal K. Srivastava and assigned to the assignee of the present application.

Although the above-described apparatus is an improvement over previously known techniques and extensively employed in numerous television receivers, it was found that the results were not completely satisfactory. Specifically, it was found that the memory capacitor tended to reach an undesirable level of charge during non-use of the apparatus whereupon a considerable period of time was required before proper operation of the apparatus was achieved upon reactivation of the apparatus.

One technique for reducing the undesired and extended period required to obtain proper operation of the apparatus after an extended period of non-use is disclosed in a U.S. Pat. application bearing Ser. No. 511,596 now U.S. Pat. No. 3,959,727 filed in the name of Dong Woo Rhee et al. Therein, a diode limiter is employed to restrict the level of charge accumulated on the memory capacitor whereupon the desired operation is achieved without an extended and undesired period of waiting for the applied energization to become effective.

Although the above-described apparatus and technique again provided improved results and is still extensively employed in television receivers, it has been found that room for improvement still exists. For example, the above apparatus requires a positive and a negative potential source which is expensive or at the very least inconvenient. Also, it has been found that the above apparatus has a restricted rate differential in so far as a different rate of charge and discharge of a given function is concerned.

OBJECTS AND SUMMARY OF THE INVENTION

An object of the present invention is to provide an enhanced television receiver. Another object of the invention is to provide an improved DC control circuit for a television receiver. Still another object of the invention is to provide a remote control function for a television receiver having a different increase rate of change. A further object of the invention is to provide improved DC control circuitry with relatively simple and inexpensive apparatus.

These and other objects are achieved in one aspect of the invention by a continuous DC control circuit having a charge storage means coupled to a sampling means providing an output potential and to a charge and discharge circuit means coupled to a switching means connected to a potential source and to a control circuit for varying the operation of the switching means to provide different potential levels for effecting different rates of charge and discharge of the charge storage means.

PREFERRED EMBODIMENT OF THE INVENTION

For a better understanding of the present invention, together with other and further objects, advantages and capabilities thereof, reference is made to the following disclosure and claims in conjunction with the accompanying drawings.

Figure 1:
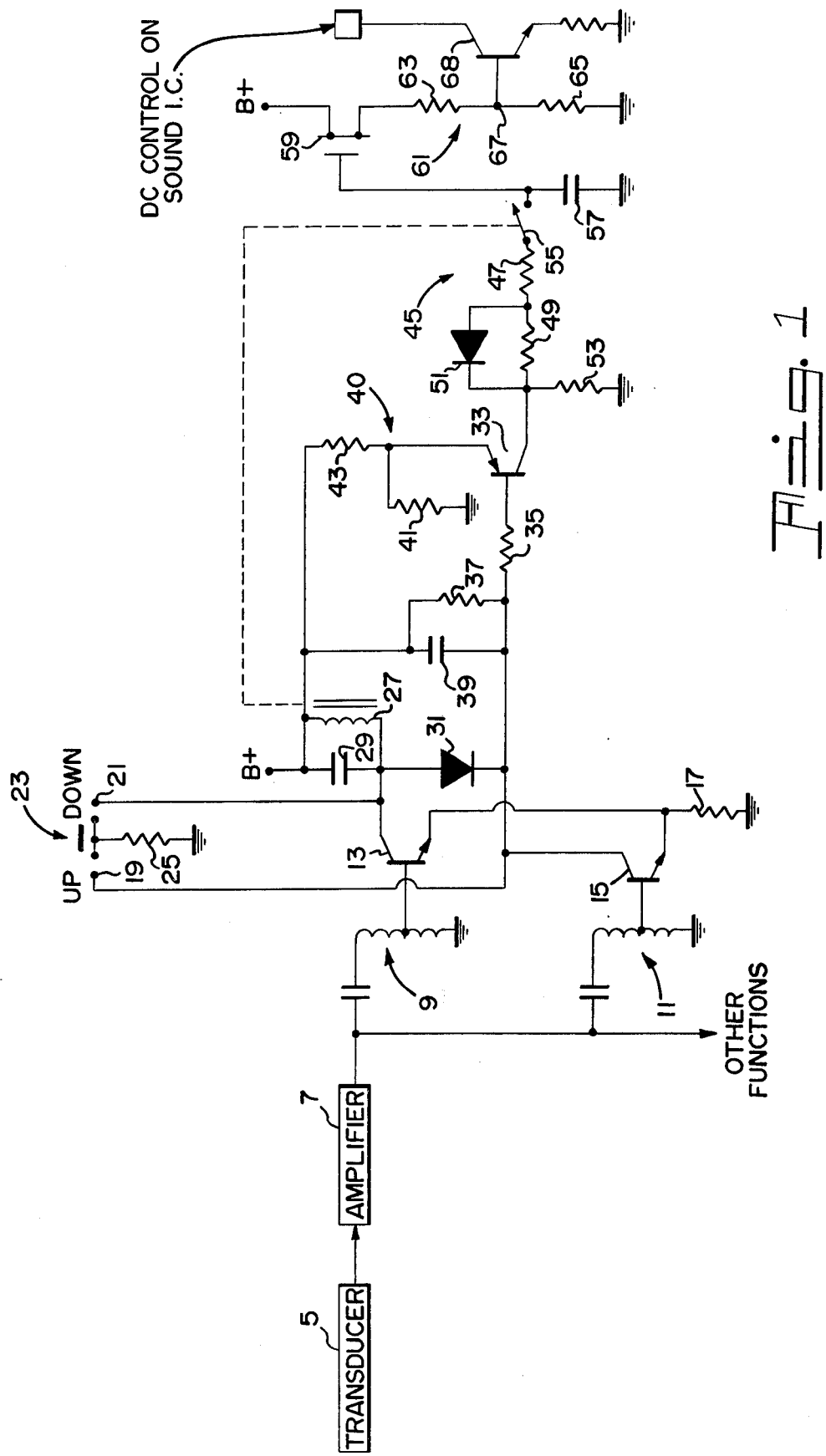
FIG. 1 is a schematic illustration of a preferred embodiment of a continuous DC control circuit employed in a remote control system of a television receiver.

Referring to the drawings, FIG. 1 illustrated a preferred embodiment of a continuous DC control circuit employed as a volume control in a remote control system of a television receiver. Therein, an ultrasonic transducer 5 receives transmitted ultrasonic signals which are coupled to an amplifier stage 7.

The amplifier stage 7 provides an output signal which is coupled to a plurality of frequency detector stages for initially remotely controlled functions in a television receiver. In this example, a first resonant circuit 9 is tuned to an ultrasonic signal representing a volume down function and a second resonant circuit 11 is tuned to an ultrasonic signal representing a volume up function.

The first resonant circuit 9 provides an output signal which is coupled to the base of a first transistor 13 while the output signal of the second resonant circuit 11 is coupled to the base of a second transistor 15. The emitter of the first and second transistors 13 and 15 are both connected to a resistor 17 coupled to a potential reference level or circuit ground.

The collectors of the first and second transistors 13 and 15 are each coupled to a separate terminal 19 and 21 respectively, of a manually operable switch 23 having a common terminal connected by a resistor 25 to circuit ground. The collector of the first transistor 13 is also connected by a relay winding 27 shunted by a capacitor 29 to a potential sourse B+. The collector of the second transistor 15 is connected to a diode 31 which is, in turn, coupled via the parallel connected relay winding 27 and capacitor 29 to the potential source B+.

A charge switching means includes a transistor 33 having a base connected to a resistor 35 coupled to the collector of the second transistor 15 and via a resistor 37 shunted by a capacitor 39 to the potential source B+. The emitter of the transistor 33 is connected to the junction of a voltage divider 40 having a first resistor 41 connected to circuit ground and a second resistor 43 coupled to the potential source B+.

The collector of the transistor 33 of the charge switching means is connected to a charge and discharge circuit means 45. This charge and discharge circuit means includes a first resistor 47 in series connection with a second resistor 49 shunted by a diode 51. A third resistor 53 couples the parallel coupled second resistor 49 and diode 51 and the collector of the transistor 33 to circuit ground.

The first resistor 47 of the charge and discharge circuit means 45 is connected via a relay arm 55, mechanically associated with the relay winding 27, to a charge storage means illustrated as a capacitor 57 connected to circuit ground. A sampling means in the form of a field-effect transistor (FET) 59 has an insulated gate coupled to the charge storage capacitor 57, a drain connected to a source of energizing voltage B+, and a source connected to a voltage divider 61 which includes first and second resistors 63 and 65 series coupling the source to a potential reference level. A junction 67 of the series connected resistors 63 and 65 provides an output for a DC volume control transistor 68.

As to operation, an ultrasonic signal received by the transducer 5 is coupled by the amplifier stage 7 to the first and second resonant circuits 9 and 11. Assuming the signal is of a first frequency, corresponding to a volume down condition, the first resonant circuit 9 will turn on the first transistor 13 causing conduction therethrough. Thereupon current flow from the source B+ via the relay winding 27, transistor 13, and resistor 17 to circuit ground will be effected. Thus, the relay arm 55 will be closed.

At the same time, the potential appearing at the base of the transistor 33 or charge switching means will be greater than the potential appearing at the emitter due to the voltage divider circuit 40. Thus, the transistor 33 remains turned off whereupon the potential appearing the collector of the transistor 33 is lower than the potential available at the charge storage capacitor 57.

As a result, the diode 51 will be rendered conductive to provide a discharge circuit from the charge capacitor 57 via the relay arm 55, a first resistor 47, diode 51, and a third resistor 53 to circuit ground. Thus, a discharge circuit which includes the conducting diode 51 and having a first time constant circuit may be constructed to provide a relatively rapid rate of discharge or decrease in volumes as illustrated by curve A of FIG. 2.

Assuming reception of a signal at a second frequency, corresponding to a volume up condition, the second resonant circuit 11 will turn on the second transistor 15. Thereupon, the collector of the second transistor 15 will approach ground potential, except for a small voltage drop across the resistor 17, and cause the transistor 33 or charge switching means to be turned on. Also, the diode 31 will be rendered conductive causing the relay winding 27 to effect closing of the relay arm 55.

Turning on the transistor 33 provides a potential at the collector which is substantially equal to the potential provided by the potential source B+ less the drop across the voltage divider 40. Thereupon, the charge storage capacitor 57 will be charged by way of a charging circuit which includes the first and second series connected resistors 47 and 49. Thus, a charge circuit having a second time constant may be constructed to provide a rate of charge which is of a less rapid rate than the rate of discharge as illustrated by curve B of FIG. 2.

Additionally, the potential appearing at the charge capacitor 57 is continuously sampled by the FET 59. Since the FET 59 is an insulated gate device, establishment of an operational potential level at the charge capacitor 57 is maintained relatively constant by the FET 59. Moreover, the voltage divider circuit 61 connected to the source of the FET 59 serves to establish a desired operational level of potential suitable for energizing the sound channel as illustrated by the shaded portion 69 of FIG. 2.

Figure 2:
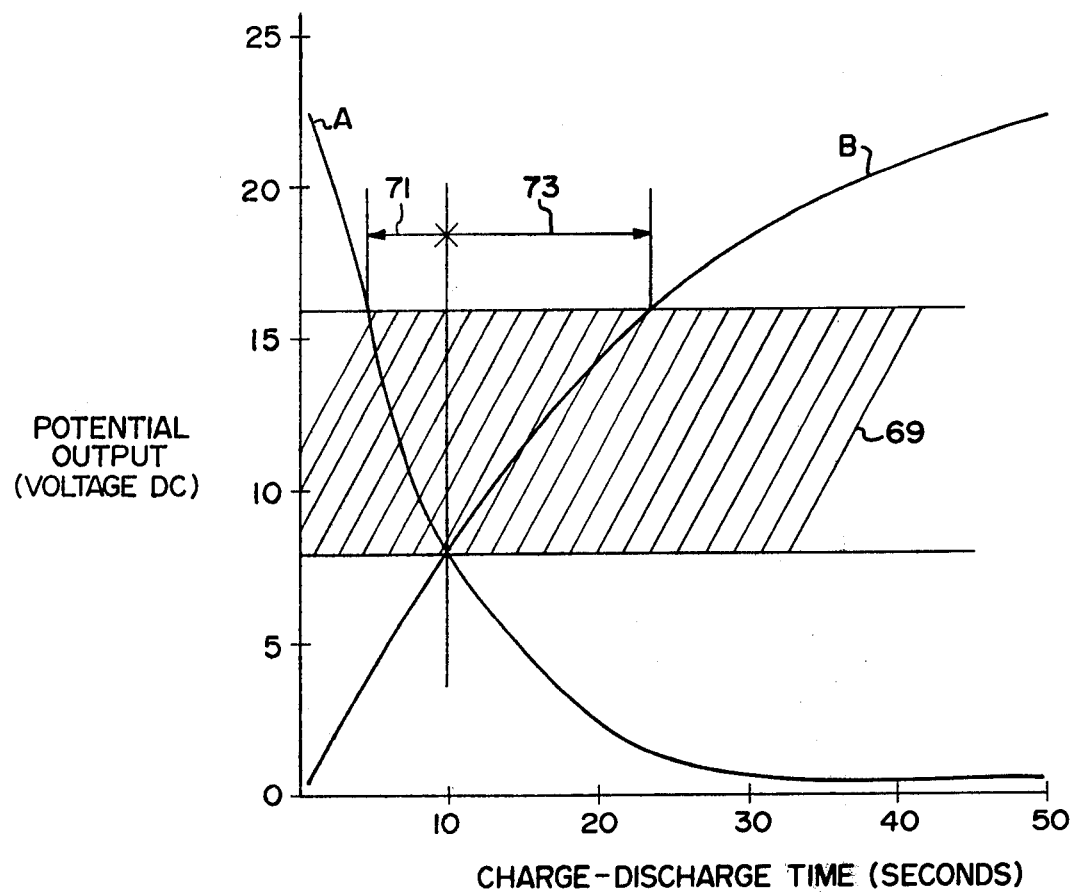
FIG. 2 is a graphic illustration of the operational charge and discharge potentials provided by the embodiment of FIG. 1.

As can readily be seen in FIG. 2, the discharge curve, Curve A, has a first time constant such that a relatively rapid rate of discharge 71 over the desired operational level 69 is achieved. Also, the charge curve, Curve B, has a second time constant such that a relatively slow or less rapid rate of charge 73 over the desired operational level is achieved.

It should also be noted that the apparatus relies upon a single potential source B+, as compared with prior known multiple potential sources, for effecting both charge and discharge of the memory capacitor. Also, the highly desirable provision of a relatively fast volume down, as compared with volume up, provides a capability which enhances the apparatus.

While there has been shown and described what is at present considered the preferred embodiment of the invention, it will be obvious to those skilled in the art that various changes and modifications may be made therein without departing from the invention as defined by the appended claims.

What is claimed is:

1. In a remote control for a television receiver, a continuous DC control circuit comprising:
    a charge storage capacitor;
    an FET having an isulated gate coupled to said charge storage capacitor and a source coupled to a voltage divider for providing an output in accordance with the potential level of said charge storage capacitor;
    a charge and discharge circuit coupled to said charge storage capacitor, said circuit comprising a series connection of a first resistor, a parallel connected second resistor and a diode, and a third resistor connected to circuit ground;
    a switching transistor coupled to said charge and discharge circuit, said transistor operating to provide first and second levels of potential to said charge and discharge circuit, thereby effecting different rates of charging and discharging said charge storage capacitor in accordance with said levels of applied potential;
    a DC potential source; and
    a control circuit coupled to said DC potential source and to said switching transistor for selectively altering the operation of said switching transistor in response to signals of a first and a second frequency.

2. A continuous DC control circuit as defined in claim 1 wherein said switching transistor has a first electrode connected to said DC potential source, a second electrode connected to said control circuit, and a third electrode connected to a junction of said second and third resistors of said charge and discharge circuit for providing a level of applied potential for charging said charge storage capacitor through a first time constant in response to signals of a first frequency and for removing said potential for discharging said charge storage capacitor through a second time constant in response to signals of a second frequency.

* * * * *

UNITED STATES PATENT AND TRADEMARK OFFICE
CERTIFICATE OF CORRECTION

PATENT NO. : 4,045,775
DATED : Aug. 30, 1977
INVENTOR(S) : Daniel S. Pearce

It is certified that error appears in the above-identified patent and that said Letters Patent are hereby corrected as shown below:

Column 1 - line 66 - Please delete "differentialin" and

Insert - differential in --

Column 2 - line 9 - After "increase" and before "rate" - please insert -- and decrease --

Signed and Sealed this

Sixteenth Day of May 1978

[SEAL]

Attest:

RUTH C. MASON
Attesting Officer

LUTRELLE F. PARKER
Acting Commissioner of Patents and Trademarks